US012658232B2

(12) United States Patent
Uchida

(10) Patent No.: US 12,658,232 B2
(45) Date of Patent: Jun. 16, 2026

(54) STORAGE DEVICE, MEMORY CELL ARRAY, METHOD FOR MANUFACTURING MEMORY CELL ARRAY, MAGNETIC HEAD, AND ELECTRONIC DEVICE

(71) Applicant: SONY SEMICONDUCTOR SOLUTIONS CORPORATION, Kanagawa (JP)

(72) Inventor: Hiroyuki Uchida, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 200 days.

(21) Appl. No.: 18/567,789

(22) PCT Filed: Feb. 24, 2022

(86) PCT No.: PCT/JP2022/007514
§ 371 (c)(1),
(2) Date: Dec. 7, 2023

(87) PCT Pub. No.: WO2022/264529
PCT Pub. Date: Dec. 22, 2022

(65) Prior Publication Data
US 2024/0274178 A1 Aug. 15, 2024

(30) Foreign Application Priority Data

Jun. 15, 2021 (JP) ................................. 2021-099300

(51) Int. Cl.
*G11C 11/16* (2006.01)
*H10B 61/00* (2023.01)
(Continued)

(52) U.S. Cl.
CPC ........ *G11C 11/1659* (2013.01); *G11C 11/161* (2013.01); *G11C 11/1675* (2013.01);
(Continued)

(58) Field of Classification Search
CPC .............. G11C 11/1659; G11C 11/161; G11C 11/1675; G11C 11/15; G11C 11/16;
(Continued)

(56) References Cited

U.S. PATENT DOCUMENTS

2014/0367814 A1* 12/2014 Ohmori .................. H10N 50/10
257/421
2016/0078907 A1* 3/2016 Woo ...................... G06F 3/0619
711/162
(Continued)

FOREIGN PATENT DOCUMENTS

JP 2004-288311 A 10/2004
JP 2009-135412 A 6/2009
(Continued)

OTHER PUBLICATIONS

International Search Report and Written Opinion of PCT Application No. PCT/JP2022/007514, issued on May 24, 2022, 09 pages of ISRWO.
(Continued)

*Primary Examiner* — Jerome Leboeuf
(74) *Attorney, Agent, or Firm* — CHIP LAW GROUP

(57) ABSTRACT

Provided is a storage device that includes a plurality of magnetic memory devices and a selection circuit that selects a desired magnetic memory device from the plurality of magnetic memory devices, in which the plurality of magnetic memory devices includes a first magnetic memory device having a characteristic that changes according to an environmental value, and a second magnetic memory device having a characteristic different from the characteristic of the first magnetic memory device. Further, the selection circuit exclusively selects the first magnetic memory device and the second magnetic memory device based on a detection result of the environmental value.

13 Claims, 9 Drawing Sheets

(51) Int. Cl.
    *H10N 50/01*         (2023.01)
    *H10N 50/10*         (2023.01)

(52) U.S. Cl.
    CPC ............. *H10B 61/00* (2023.02); *H10B 61/22* (2023.02); *H10N 50/01* (2023.02); *H10N 50/10* (2023.02)

(58) Field of Classification Search
    CPC ............ G11C 11/1653; G11C 11/1673; G11C 11/5607; H10B 61/00; H10B 61/22; H10N 50/01; H10N 50/10
    See application file for complete search history.

(56)            References Cited

U.S. PATENT DOCUMENTS

| | | | |
|---|---|---|---|
| 2018/0068702 A1* | 3/2018 | Jung | ...................... H10N 50/85 |
| 2020/0066320 A1 | 2/2020 | Sobey | |

| | | | |
|---|---|---|---|
| 2020/0083286 A1 | 3/2020 | Manipatruni | |
| 2021/0110857 A1* | 4/2021 | Endoh | .................. H10N 70/826 |
| 2021/0134339 A1* | 5/2021 | Song | ...................... H10N 50/85 |

FOREIGN PATENT DOCUMENTS

| | | |
|---|---|---|
| JP | 2010-092521 A | 4/2010 |
| JP | 2017-139399 A | 8/2017 |
| TW | 201507106 A | 2/2015 |

OTHER PUBLICATIONS

Mangin, et al., "Current-induced magnetization reversal in nanopillars with perpendicular anisotropy", Nature materials, vol. 5, Mar. 2006, pp. 210-215.

\* cited by examiner

START

GENERATE DETECTION SIGNAL — S1

INPUT DETECTION SIGNAL TO SELECTION CIRCUIT — S2

SELECT MAGNETIC MEMORY DEVICE ACCORDING TO DETECTION SIGNAL — S3

READ AND WRITE TO SELECTED MAGNETIC MEMORY DEVICE — S4

END

STORAGE DEVICE, MEMORY CELL ARRAY, METHOD FOR MANUFACTURING MEMORY CELL ARRAY, MAGNETIC HEAD, AND ELECTRONIC DEVICE

CROSS REFERENCE TO RELATED APPLICATIONS

This application is a U.S. National Phase of International Patent Application No. PCT/JP2022/007514 filed on Feb. 24, 2022, which claims priority benefit of Japanese Patent Application No. JP 2021-099300 filed in the Japan Patent Office on Jun. 15, 2021. Each of the above-referenced applications is hereby incorporated herein by reference in its entirety.

FIELD

The present disclosure relates to a storage device, a memory cell array, a method for manufacturing a memory cell array, a magnetic head, and an electronic device.

BACKGROUND

For example, Patent Literature 1 discloses a method for setting a read/write current pulse width to a magnetic memory device according to the temperature.

CITATION LIST

Patent Literature

Patent Literature 1: JP 2010-92521 A

Non Patent Literature

Non Patent Literature 1: S. Mangin et al., Nature materials, vol. 5, March 2006, p. 210

SUMMARY

Technical Problem

In the method of Patent Literature 1, since the operating conditions such as power consumption and writing time change according to the temperature, the operation becomes complicated. The same applies to environmental changes other than temperature changes.

An aspect of the present disclosure provides a storage device, a memory cell array, a method for manufacturing a memory cell array, a magnetic head, and an electronic device that can realize an easy adaptation to environmental changes.

Solution to Problem

A storage device according to one aspect of the present disclosure includes: a plurality of magnetic memory devices; and a selection circuit that selects a desired magnetic memory device from the plurality of magnetic memory devices, wherein the plurality of magnetic memory devices includes: a first magnetic memory device having a characteristic that changes according to an environmental value; and a second magnetic memory device having a characteristic different from the characteristic of the first magnetic memory device, and the selection circuit exclusively selects the first magnetic memory device and the second magnetic memory device based on a detection result of the environmental value.

A memory cell array according to one aspect of the present disclosure includes: a first magnetic memory device having a characteristic that changes according to an environmental value; a second magnetic memory device having a characteristic different from the characteristic of the first magnetic memory device; and a wiring capable of exclusively selecting the first magnetic memory device and the second magnetic memory device.

A method for manufacturing a memory cell array according to one aspect of the present disclosure includes: forming a first magnetic memory device having a characteristic that changes according to an environmental value; forming a second magnetic memory device having a characteristic different from the characteristic of the first magnetic memory device; and forming a wiring capable of exclusively selecting the first magnetic memory device and the second magnetic memory device.

A magnetic head according to one aspect of the present disclosure includes: a first magnetic memory device having a characteristic that changes according to an environmental value; and a second magnetic memory device having a characteristic different from the characteristic of the first magnetic memory device, the magnetic head being configured to be capable of exclusively selecting the first magnetic memory device and the second magnetic memory device.

An electronic device according to one aspect of the present disclosure is an electronic device on which a storage device is mounted, wherein the storage device includes: a plurality of magnetic memory devices; and a selection circuit that selects a desired magnetic memory device from the plurality of magnetic memory devices, the plurality of magnetic memory devices includes: a first magnetic memory devices having a characteristic that changes according to an environmental value; and a second magnetic memory devices having a characteristic different from the characteristic of the first magnetic memory devices, and the selection circuit exclusively selects the first magnetic memory device and the second magnetic memory device based on a detection result of the environmental value.

BRIEF DESCRIPTION OF DRAWINGS

FIG. 11 is a sectional view schematically depicting an example of disposition of a magnetic memory device.

DESCRIPTION OF EMBODIMENTS

Figure 1:
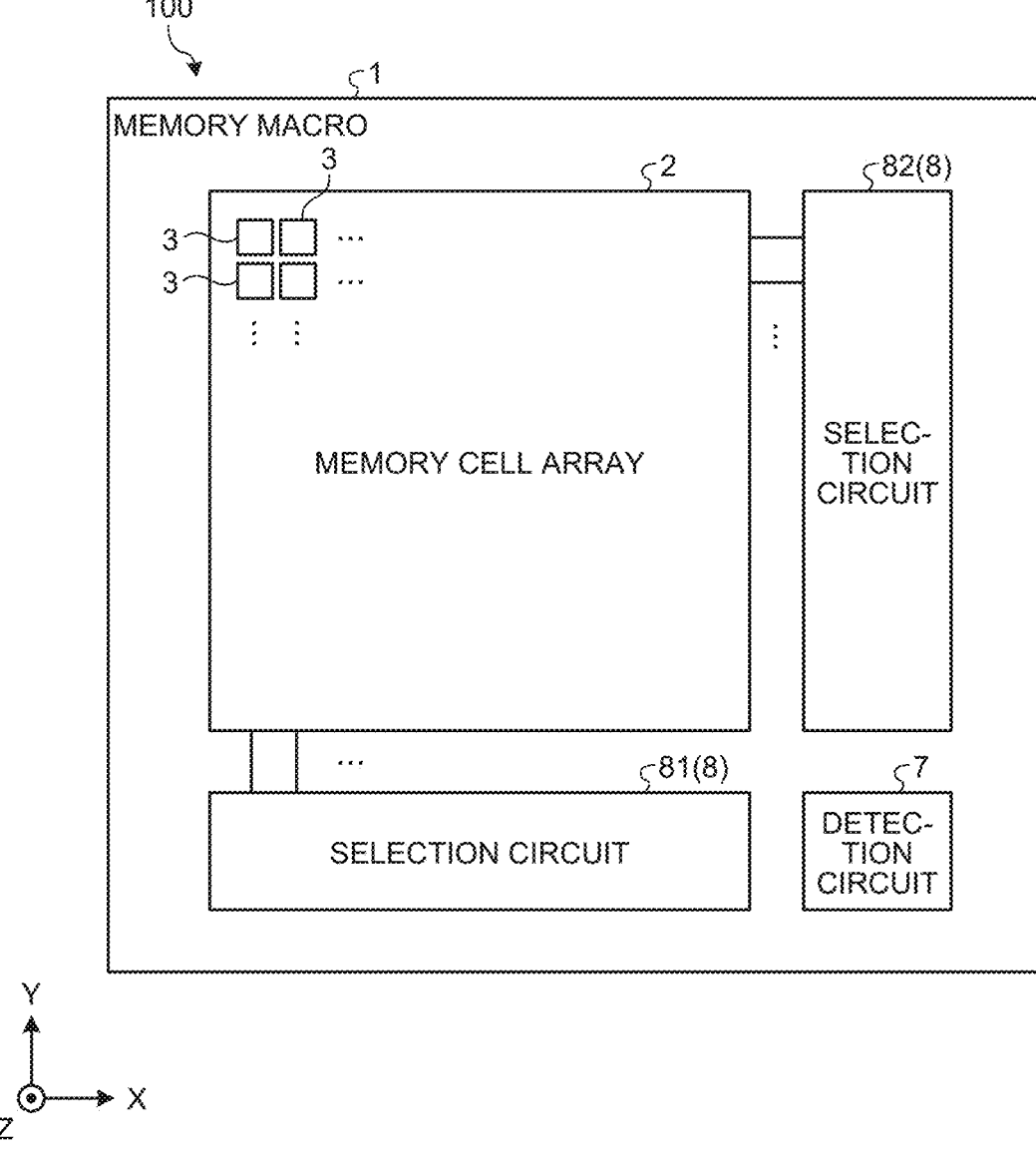
FIG. 1 is a diagram depicting an example of a schematic configuration of a storage device according to an embodiment.

Hereinafter, embodiments of the present disclosure will be described in detail with reference to the drawings. In each of the following embodiments, the same elements are denoted by the same reference signs, and repetitive description will be omitted. The size of each element appearing in the drawings is not necessarily accurate. In some figures, an XYZ coordinate system is illustrated.

The present disclosure will be described according to the following item order.

0. Introduction
1. Embodiment
2. Modification
3. Example of Applications
4. Example of Effects

0. Introduction

Along with the rapid development of various information devices from large-capacity servers to mobile terminals, further improvement in performance such as higher integration, higher speed, and lower power consumption has been pursued in devices such as memories and logics constituting the information devices. In particular, semiconductor nonvolatile memories have remarkably advanced, and flash memories as particularly large-capacity file memories have been widely used at a pace of expelling hard disk drives. On the other hand, in consideration of development into code storage and working memory, ferroelectric random access memory (FeRAM), magnetic random access memory (MRAM), phase-change random access memory (PCRAM), and the like have been developed to replace NOR flash memory, DRAM, and the like that are commonly used now, and some of them have already been put into practical use.

Of these, MRAM is rewritable at high speed and almost infinitely (1015 times or more) because it stores data according to the magnetization direction of a magnetic body, and it is already used in fields such as industrial automation and aircraft. Although MRAM is expected to be developed in code storage or working memory in the future due to its high-speed operation and reliability, MRAM actually has problems in low power consumption and large capacity. These are essential problems caused by the recording principle of MRAM, that is, a system of reversing the magnetization by a current magnetic field generated from wiring. As a method for solving this problem, a recording method not depending on a current magnetic field (that is, magnetization reversal) has been studied, and in particular, research on spin torque magnetization reversal is actively conducted. A storage device with spin torque magnetization reversal is constituted by a magnetic tunnel junction (MTJ) similarly to MRAM, and the device utilizes the fact that spin-polarized electrons passing through a magnetic layer fixed in a certain direction apply torque to another free (non-fixed direction) magnetic layer when entering the magnetic layer, and the free magnetic layer is reversed when a current equal to or larger than a certain threshold value flows. The 0/1 rewriting is performed by changing the polarity of the current. The absolute value of the current for this reverse is 1 mA or less in a device of a scale of about 0.1 um, and this current value decreases in proportion to the device volume, which enables scaling. In addition, since a word line for generating a current magnetic field for recording, which is necessary in MRAM, is not required, there is also an advantage that the cell structure is simplified.

In the present disclosure, an MRAM using spin torque magnetization reversal is referred to as a spin transfer torque-magnetic random access memory (STT-MRAM). As a nonvolatile memory capable of achieving low power consumption and large capacity while maintaining the advantage of MRAM that is high in speed and rewritable almost infinitely, STT-MRAM has been greatly expected.

Various materials have been studied as ferromagnets used for STT-MRAM, and it is generally considered that those having perpendicular magnetic anisotropy are more suitable for reduction in power and increase in capacity than those having in-plane magnetic anisotropy. This is because the perpendicular magnetization has a lower energy barrier to be exceeded at the time of spin torque magnetization reversal, and the high magnetic anisotropy of a perpendicular magnetization layer (or film) is advantageous for maintaining the thermal stability of a storage medium miniaturized by increasing the capacity.

To apply STT-MRAM as a competitive memory to various applications, there are the following problems. For example, in a vehicle-mounted STT-MRAM, it is necessary to ensure operation in a wide range of temperature such as −40° C. to 125° C., and to simultaneously satisfy, in particular, a write voltage at a low temperature and information retention at a high temperature, required specifications for an MTJ device having temperature dependence are very high. There is a method of controlling the write pulse width suitable for the MTJ device for each temperature as in Patent Literature 1, but since the power consumption and the write time fluctuate, the memory operation becomes complicated.

In an aspect of the technology to be disclosed, two or more different MTJs (materials, processing, and sizes) are present, for example, in the same memory macro. The different MTJs are disposed on different word lines, whereby MTJs for use are switched by word line selection reflecting monitored temperatures. As a result, by switching a plurality of MTJ devices (for a high temperature, for a low temperature) to form optimal operating conditions at respective temperatures with respect to the operating temperature of STT-MRAM, an STT-MRAM adapted to a wide temperature range is provided without changing the operating conditions of the memory.

1. Embodiment

FIG. 1 is a diagram depicting an example of a schematic configuration of a storage device according to an embodiment. A storage device 100 includes a memory macro 1. The memory macro 1 includes a memory cell array 2, a detection circuit 7, and a selection circuit 8.

The memory cell array 2 includes a plurality of memory cells 3. The plurality of memory cells 3 are disposed in an array in an X-axis direction and a Y-axis direction. As described later with reference to FIG. 2, one memory cell 3 includes one magnetic memory device. In this sense, the memory cell array 2 may also be said to be a memory device array including a plurality of magnetic memory devices.

Figure 2:
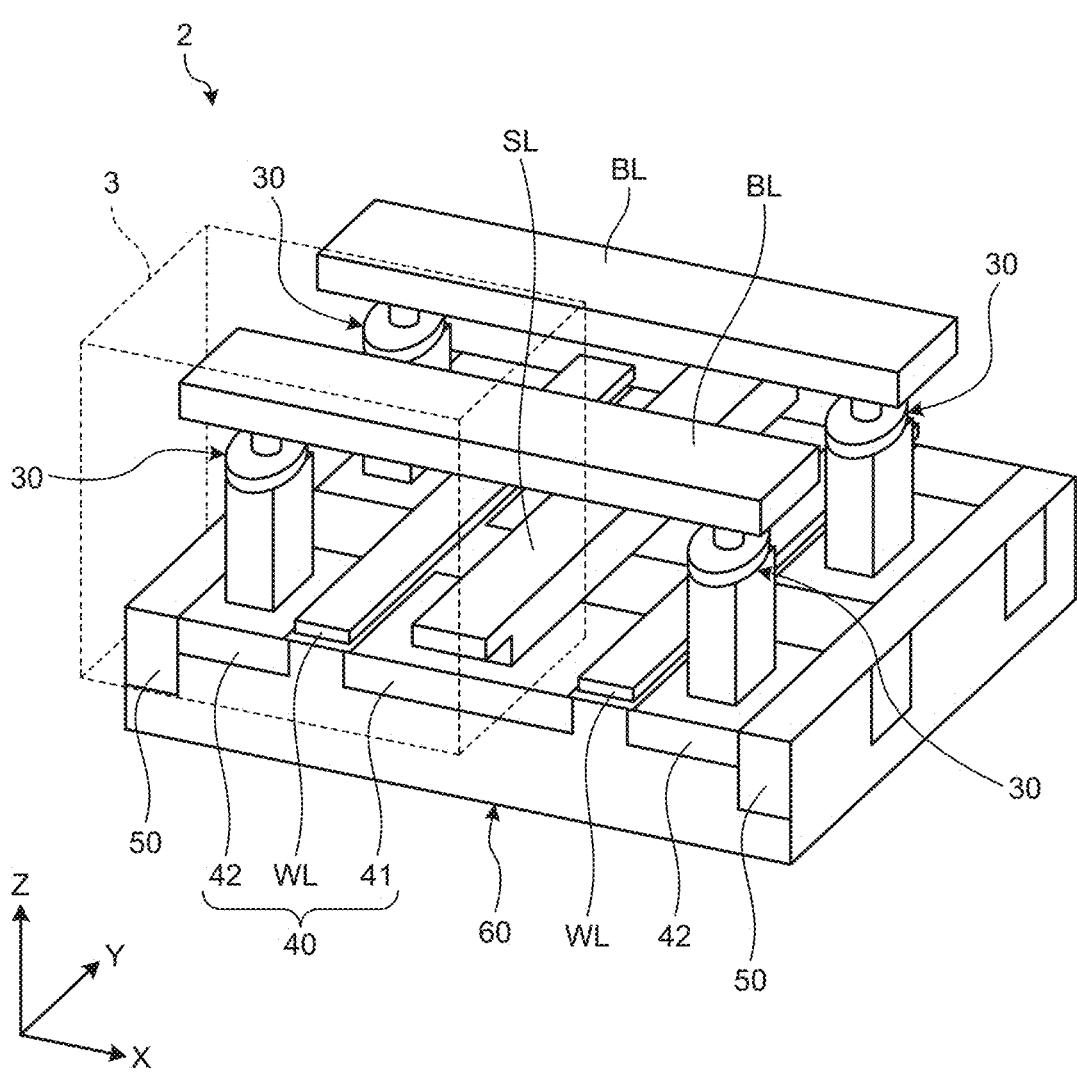
FIG. 2 is a diagram depicting an example of a schematic configuration of a memory cell array.

FIG. 2 is a diagram depicting an example of a schematic configuration of a memory cell array. The memory cell array 2 includes a semiconductor substrate 60 and wiring in addition to a magnetic memory device 30. Examples of the wiring include a bit line BL, a word line WL, and a sense line SL. The semiconductor substrate 60 is, for example, a semiconductor substrate such as a silicon substrate.

There are a plurality of bit lines BL, a plurality of word lines WL, and a plurality of sense lines SL, which extend from the memory cell array 2, that is, a plurality of magnetic memory devices 30, to the selection circuit 8 (FIG. 1). The bit lines BL and the word lines WL are two types of address wirings intersecting each other. The sense lines SL are provided corresponding to the bit lines BL. In this example, the bit lines BL extend in the X-axis direction, and the word lines WL extend in the Y-axis direction.

The magnetic memory device 30 is disposed on the semiconductor substrate 60 (in this example, on the Z-axis positive direction side). Each magnetic memory device 30 is disposed in association with (for example, near) an intersection between the bit line BL and the word line WL. One terminal of the magnetic memory device 30 is connected to the bit line BL. For example, an upper electrode (not illustrated) of the magnetic memory device 30 is electrically connected to the bit line BL. The other terminal of the magnetic memory device 30 is connected to a selection transistor 40 to be described later. For example, a lower electrode (not illustrated) of the magnetic memory device 30 is connected to the selection transistor 40.

Note that "connected" may mean being electrically connected. Another element may be interposed between the elements connected to each other as long as the function of the elements is not lost.

The semiconductor substrate 60 includes a plurality of selection transistors 40 and a device isolation region 50. The device isolation region 50 provides an electrically isolated region. The selection transistors 40 are formed in regions isolated by the device isolation region 50. Each of the plurality of selection transistors 40 corresponds to one magnetic memory device 30 and is provided to select the magnetic memory device 30.

As surrounded and indicated by broken lines in FIG. 2, one memory cell 3 includes the corresponding magnetic memory device 30 and selection transistor 40. FIG. 2 schematically illustrates portions corresponding to four memory cells 3 among the plurality of memory cells 3 included in the memory cell array 2. In one memory cell 3, the magnetic memory device 30 and the selection transistor 40 are connected between the corresponding bit line BL and sense line SL.

The illustrated selection transistor 40 is an FET and includes a source region 41, a drain region 42, and a gate region. A gate electrode provided for the gate region is connected to the word line WL. In the example illustrated in FIG. 2, the word line WL includes the gate electrode. The source region 41 is connected with the sense line SL. The drain region 42 is connected with the other terminal of the magnetic memory device 30. In this example, the source region 41 is formed in common with the source region 41 of an adjacent selection transistor 40.

The magnetic memory device 30 is connected between the drain region 42 of the selection transistor 40 and the bit line BL in the Z-axis direction. The connection is established via, for example, a contact layer (via or the like).

The bit line BL, the word line WL, and the sense line SL are connected to the selection circuit 8 (FIG. 1) so that a desired current can be caused to flow by applying a voltage to the magnetic memory device 30. At the time of writing information, a voltage for causing a current to flow through the magnetic memory device 30 is applied via the bit line BL and the sense line SL corresponding to a desired memory cell. A voltage is applied to the word line WL corresponding to a desired memory cell, that is, the gate electrode of the selection transistor 40, and the selection transistor 40 is turned on (conductive state), whereby a current flows through the magnetic memory device 30. A current flows through the magnetic memory device 30, and information is written (stored) by spin torque magnetization reversal. At the time of reading out information, a voltage is applied to the word line WL corresponding to a desired memory cell, that is, the gate electrode of the selection transistor 40, and a current flowing between the bit line BL and the sense line SL, that is, a current flowing through the magnetic memory device 30 is detected. The detection of the current means detection of the magnitude of the electric resistance, and information is read out by this detection.

Figure 3:
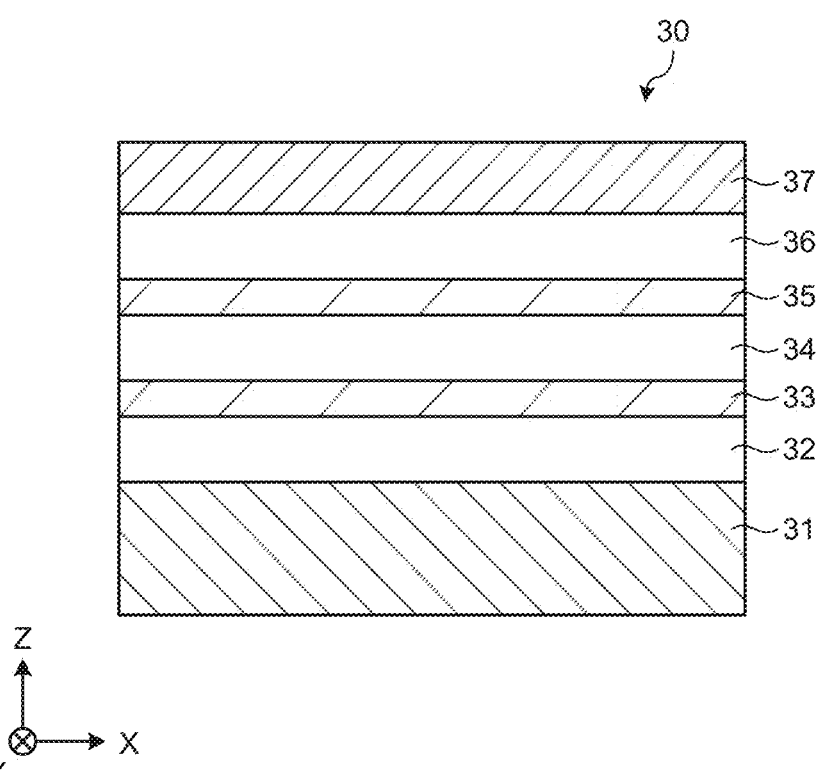
FIG. 3 is a sectional view schematically depicting an example of a schematic configuration of a magnetic memory device.

FIG. 3 is a sectional view schematically depicting an example of a schematic configuration of a magnetic memory device. The magnetic memory device 30 is a perpendicular magnetization type STT-MRAM and has a stacked structure. The Z-axis direction corresponds to a stacking direction (vertical direction). The X-axis direction and the Y-axis direction correspond to extending directions (plane direction) of the layer.

The magnetic memory device 30 includes an underlayer 31, a magnetization fixed layer 32, an insulating layer 33, a storage layer 34, an upper tunnel barrier layer 35, an upper magnetization fixed layer 36, and a cap layer 37. In this example, the underlayer 31, the magnetization fixed layer 32, the insulating layer 33, the storage layer 34, the upper tunnel barrier layer 35, the upper magnetization fixed layer 36, and the cap layer 37 are stacked in this order in the Z-axis positive direction. Although the magnetization direction of the storage layer 34 is reversed by spin torque magnetization reversal, the magnetization arrangement of the magnetization fixed layer 32 and the upper magnetization fixed layer 36 is not reversed, and the storage layer 34, the magnetization fixed layer 32, and the upper magnetization fixed layer 36 are in an antiparallel state with each other. In such a spin transfer torque memory, "0" and "1" of information are defined by a relative angle between magnetization of the storage layer 34 and magnetization of the upper magnetization fixed layer 36.

The insulating layer 33 and the upper tunnel barrier layer 35 serving as tunnel barrier layers (tunnel insulating layers) are provided between the storage layer 34 and each of the magnetization fixed layer 32 and the upper magnetization fixed layer 36, and an MTJ device is configured. The underlayer 31 is formed under the magnetization fixed layer 32, and the cap layer 37 is formed on the upper magnetization fixed layer 36.

Examples of the material of the insulating layer 33 and the upper tunnel barrier layer 35 include MgO (magnesium oxide). The material is not limited to MgO, and for example, various insulators, dielectrics, and semiconductors such as Al2O3 (aluminum oxide), AlN (aluminum nitride), SiO2, Bi2O3, MgF2, CaF, SrTiO2, AlLaO3, and Al—N—O may be used.

The storage layer 34 is made of a ferromagnet having a magnetic moment in which a magnetization direction freely changes in a direction perpendicular to the layer surface (Z-axis direction). The magnetization fixed layer 32 and the upper magnetization fixed layer 36 are made of a ferromagnet having a magnetic moment in which magnetization is fixed in the direction perpendicular to the layer surface.

Information is stored by a magnetization direction of a storage layer having uniaxial (for example, Z-axis direction) anisotropy. Writing is performed by applying a current in the direction perpendicular to the layer surface to cause spin torque magnetization reversal. For the storage layer 34 whose magnetization direction is reversed by spin injection, the magnetization fixed layer 32 is provided via the insulating layer 33, and the upper magnetization fixed layer 36 is provided via the upper tunnel barrier layer 35, and these fixed layers are used as references of storage information (magnetization direction) of the storage layer 34.

Examples of the material of the storage layer 34, the magnetization fixed layer 32, and the upper magnetization fixed layer 36 include Co—Fe—B. Since the magnetization fixed layer 32 and the upper magnetization fixed layer 36 are references of information, it is required that the magnetization direction of these layers does not change due to recording or reading. However, the magnetization direction does not necessarily need to be fixed in a specific direction, and the coercive force may be made larger than that of the storage layer 34, the layer thickness (or film thickness) may be made larger than that of the storage layer 34, or the magnetic damping constant may be made larger to make the magnetization direction less likely to move than that of the storage layer. In the case of fixing the magnetization, the magnetization fixed layer 32 or the upper magnetization fixed layer 36 may be indirectly fixed by bringing an antiferromagnetic body such as PtMn or IrMn into contact with the magnetization fixed layer 32 or the upper magnetization fixed layer 36 or magnetically coupling a magnetic body in contact with such an antiferromagnetic body via a non-magnetic body such as Ru.

In an embodiment, the composition of the storage layer 34 is adjusted such that the magnitude of the effective demagnetizing field received by the perpendicular magnetization layer in the storage layer 34 is smaller than the saturation magnetization amount (hereinafter, also referred to as "saturation magnetization amount Ms"). As described above, the ferromagnetic material Co—Fe—B composition of the storage layer 34 is selected, and the magnitude of the effective demagnetizing field received by the storage layer 34 is reduced so as to be smaller than the saturation magnetization amount Ms of the storage layer 34. This causes the magnetization of the storage layer 34 to be directed in the direction perpendicular to the layer surface.

In an embodiment, using a magnesium oxide layer as the insulating layer 33 and the upper tunnel barrier layer 35 can increase the magnetoresistance ratio (MR ratio). By increasing the MR ratio in this manner, the efficiency of spin injection can be improved, and the current density required for reversing the magnetization direction of the storage layer 34 can be reduced. In addition, the material of the insulating layer 33 and the upper tunnel barrier layer 35 may be replaced with a metal material as an intermediate layer, and spin injection may be performed by the giant magnetoresistance (GMR) effect.

According to the magnetic memory device 30 described above, the storage layer 34 of the magnetic memory device 30 is configured such that the magnitude of the effective demagnetizing field received by the storage layer 34 is smaller than the saturation magnetization amount (also referred to as the saturation magnetization amount Ms) of the storage layer 34. The demagnetizing field received by the storage layer 34 is low, and the amount of write current necessary for reversing the magnetization direction of the storage layer 34 can be reduced. This is because since the storage layer 34 has perpendicular magnetic anisotropy, the reversal current of the perpendicular magnetization STT-MRAM can be applied, which is advantageous in terms of the demagnetizing field.

On the other hand, since the amount of write current can be reduced without reducing the saturation magnetization amount Ms of the storage layer 34, it is possible to secure the thermal stability of the storage layer 34 by setting the saturation magnetization amount Ms of the storage layer 34 to a sufficient amount. Further, since the magnetization fixed layer 32 and the upper magnetization fixed layer 36 have a stacked ferrimagnet pinned structure, it is possible to make these fixed layers slow against an external magnetic field, to block a leakage magnetic field caused by these fixed layers, and to enhance the perpendicular magnetic anisotropy of the magnetization fixed layer 32 and the upper magnetization fixed layer 36 through interlayer coupling of a plurality of magnetic layers. Since the thermal stability, which is the information holding capability, can be sufficiently secured like this, the magnetic memory device 30 having an excellent characteristic balance can be configured.

As described above, the information is stored (written) by the magnetization direction of the storage layer 34 having uniaxial anisotropy. Writing is performed by applying a current in the direction perpendicular to the layer surface (Z-axis direction) to cause spin torque magnetization reversal.

Here, spin torque magnetization reversal will be briefly described. Electrons have two types of spin angular momenta. This may be defined as upward momentum and downward momentum. The numbers of the momenta are the same in a non-magnetic body, and the numbers of the momenta are different from each other in a ferromagnetic body. A case where the directions of the magnetic moments of two layers of ferromagnets are in an antiparallel state and electrons are caused to move from the lower magnetic body to the upper magnetic body will be considered. Here, the lower magnetic body is the magnetization fixed layer 32 or the upper magnetization fixed layer 36 whose magnetic direction is fixed due to high coercive force or the like, and the upper magnetic body is the storage layer 34. The electrons having passed through the magnetization fixed layer 32 or the upper magnetization fixed layer 36 are spin-polarized, that is, there is a difference in the number of upward and downward electrons. When the thickness of the non-magnetic body is sufficiently thin and reaches the other magnetic body, that is, the storage layer 34 before the polarization is relaxed and the nonpolarized state (having the same number of upward and downward electrons) in a normal non-magnetic body is obtained, the signs of the spin polarization are reversed, so that some electrons are reversed, that is, the direction of the spin angular momentum is reversed to lower the energy of the system. At this time, since the total angular momentum of the system needs to be saved, a reaction equivalent to the total change in angular momentum due to electrons having changed the direction is also applied to the magnetic moment of the magnetism. In a case where the current, that is, the number of electrons passing in the unit time is small, the angular momentum change generated in the magnetic moment of the storage layer 34 is also small because the total number of electrons that change the direction is also small. However, as the current increases, a large amount of angular momentum change can be given in the unit time. The temporal change of the angular momentum is torque, and when the torque exceeds a certain threshold value, the magnetic moment of the storage layer 34 starts to be reversed, and becomes stable when rotated by 180 degrees due to its uniaxial anisotropy. That is, reverse from the antiparallel state to the parallel state occurs.

In the magnetization parallel state, when a current is reversely caused to flow in a direction in which electrons are sent from the storage layer 34 to the magnetization fixed layer 32 or the upper magnetization fixed layer 36, torque is applied when the spin-reversed electrons enter the storage layer 34 at the time of being reflected by the magnetization fixed layer 32 or the upper magnetization fixed layer 36, and the electrons can be reversed to the antiparallel state. However, at this time, the amount of current required to cause reverse is larger than that in the case of reversing from the antiparallel state to the parallel state. Although it is difficult to intuitively understand the reverse from the parallel state to the antiparallel state, it may be considered that the reverse cannot be performed because the magnetization fixed layer 32 and the upper magnetization fixed layer 36 are fixed, and the storage layer 34 is reversed to save the angular momentum of the entire system. In this manner, the 0/1 information is recorded by causing a current equal to or larger than a certain threshold value corresponding to each polarity to flow in the direction from the magnetization fixed layer 32 or the upper magnetization fixed layer 36 to the storage layer 34 or in the opposite direction.

Assuming that a reverse current of a perpendicular magnetization STT-MRAM is Ic_perp, $$\text{Parallel} \rightarrow \text{antiparallel Ic\_perp} = (A \cdot \alpha \cdot Ms \cdot V/g(0)/P)(Hk - 4\pi Ms)$$

$$\text{antiparallel} \rightarrow \text{parallel Ic\_perp} = -(A \cdot \alpha \cdot Ms \cdot V/g(\pi)/P)(Hk - 4\pi Ms)$$

are satisfied.

On the other hand, when the reverse current of an in-plane magnetization STT-MRAM is Ic_para, $$\text{Parallel} \rightarrow \text{antiparallel Ic\_para} = (A \cdot \alpha \cdot Ms \cdot V/g(0)/P)(Hk + 2\pi Ms)$$

$$\textit{antiparallel} \rightarrow \textit{parallel } \text{Ic\_para} = -(A \cdot \alpha \cdot Ms \cdot V/g(\pi)/P)(Hk + 2\pi Ms)$$

are satisfied.

In the above Formulas, A is a constant, a is a damping constant, Ms is saturation magnetization, V is device volume, g (0) P and g (π) P are coefficients corresponding to efficiency at which spin torque is transmitted to a counterpart magnetic layer at the parallel state and the antiparallel state, respectively, and Hk is magnetic anisotropy (Non-Patent Literature 1). In the above Formulas, when (Hk−4° C. Ms) in the case of the perpendicular magnetization type is compared with (Hk+2πMs) in the case of the in-plane magnetization type, it can be understood that the perpendicular magnetization type is more suitable for reducing the recording current.

The information is read out by using the tunnel magnetoresistance (TMR) effect. That is, in the magnetic memory device 30, the magnitude of the electrical resistance between the electrodes changes according to the relationship (for example, whether parallel or antiparallel) between the magnetization direction of the magnetization fixed layer 32 or the upper magnetization fixed layer 36 and the magnetization direction of the storage layer 34. By detecting the electric resistance with current detection, the magnetization direction of the storage layer 34, that is, the information written (stored) in the storage layer 34 is read out. The current at the time of reading out is much smaller than the current at the time of writing, and does not affect the magnetization direction of the storage layer 34. Thus, information can be read out in a non-destructive manner.

The characteristics of the magnetic memory device 30 change depending on the environment. Examples of the environment include temperature, light, magnetic field, and impact. A value directly or indirectly indicating such an environment is referred to as "environmental value". For example, in the case of a value indicating the temperature as the environment, the environmental value may be the temperature itself, or may be a current value or a voltage value detected by a temperature sensor or the like. The magnetic memory device 30 has characteristics that change according to the environmental value. An example of the characteristics is a retention property with respect to the environmental value, and is represented by, for example, an index such as the magnetic anisotropy Hk described above or the holding force (Oe). When the environmental value is a temperature, the retention is retention of thermal stability. Hereinafter, unless otherwise specified, the environmental value is a temperature. Another example of the characteristics is a voltage necessary for writing information or reading out information, for example, a voltage applied to the bit line BL, the sense line SL, the word line WL, and the like (including the drive voltage of the selection transistor 40). This voltage may mean a voltage within a certain range, and such a voltage is also referred to as a voltage Vc. Another example of the characteristics is the resistance change rate TMR.

According to the technology to be disclosed, it is possible to obtain practical retention, the resistance change rate TMR, and the like in a wide temperature range can be obtained without changing the operating conditions, that is, under the same operating conditions. The operation conditions here are conditions of an operation related to reading and writing of information from and to the magnetic memory device 30. An example of the operating conditions is the voltage Vc described above. The same operation conditions mean that the magnitude (range) of the voltage Vc, the application period (pulse width), and the like, and the power consumption and the like due to the conditions are substantially the same (for example, within the range of design errors, variations, and the like).

In the present embodiment, the storage device 100 includes a plurality of magnetic memory devices 30 having different characteristics from each other. Two types of magnetic memory devices 30, that is, a magnetic memory device 30-1 (first magnetic memory device) and a magnetic memory device 30-2 (second magnetic memory device) will be described as an example of the plurality of magnetic memory devices 30 having different characteristics.

Figure 4:
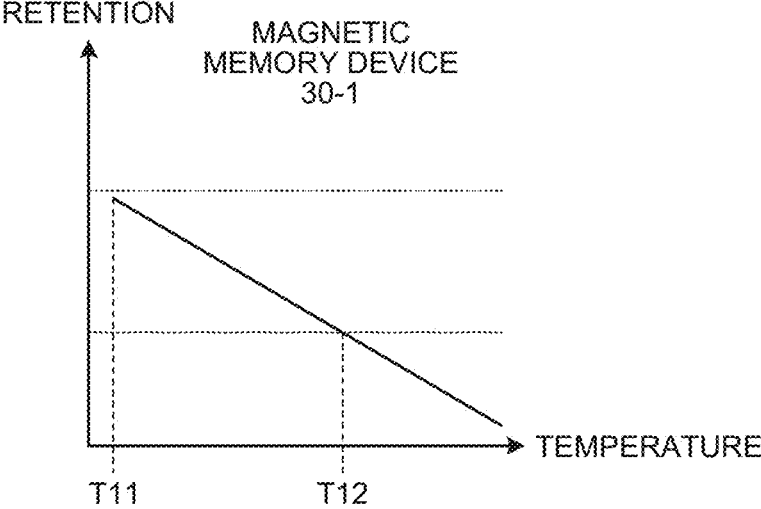
FIG. 4 is a sectional view schematically depicting an example of a characteristic of a magnetic memory device.
Figure 5:
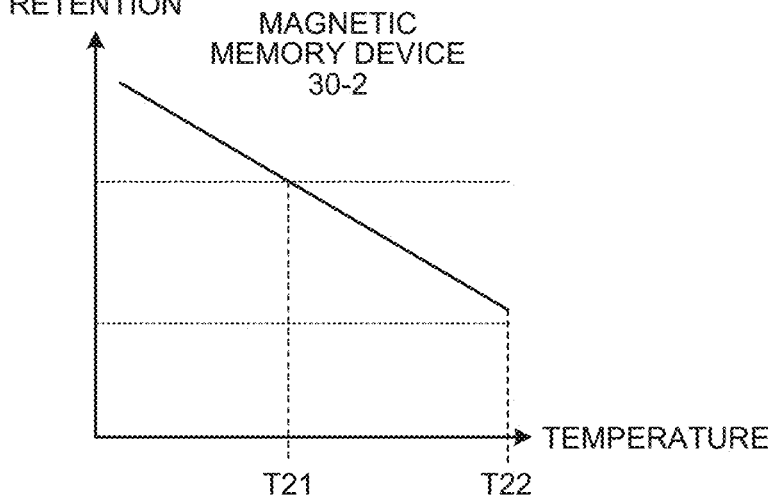
FIG. 5 is a sectional view schematically depicting an example of a characteristic of a magnetic memory device.

FIGS. 4 and 5 are sectional views each schematically depicting an example of a characteristic of a magnetic memory device. The horizontal axis of each graph schematically indicates a temperature, and the vertical axis of each graph schematically indicates the degree of retention. The operating conditions are the same. In the drawings, the practical retention ranges (upper limit and lower limit) are schematically indicated by a pair of broken lines.

FIG. 4 illustrates characteristics of the magnetic memory device 30-1. The magnetic memory device 30-1 has practical retention and the like in the range of a temperature T11 to a temperature T12. The temperature T11 may be, for example, −40° C. or lower. FIG. 5 illustrates characteristics of the magnetic memory device 30-2. The magnetic memory device 30-2 has practical retention and the like in the range of a temperature T21 to a temperature T22. The temperature T22 may be, for example, 125° C. or higher. The temperature T21 is higher than the temperature T11 and is equal to or lower than the temperature T12. The temperature T22 is higher than the temperature T12. By selectively using the magnetic memory device 30-1 and the magnetic memory device 30-2 as described above according to the temperature, it is possible to obtain practical retention in a wide temperature range from the temperature T11 to the temperature T22 (for example, −40° C. to 125° C.) without changing the operation conditions. Here, the retention has been described as an example of the characteristics of the magnetic memory device 30, but the voltage Vc and the resistance change rate TMR may also be described in the manner. In this case, the vertical axis of the graph may correspond to the voltage Vc or the resistance change rate TMR.

When the magnetic memory device 30-1 and the magnetic memory device 30-2 are compared to each other, the magnetic memory device 30-1 is an MTJ device for a low temperature suitable for use at a relatively low temperature. The magnetic memory device 30-2 is an MTJ device for a high temperature suitable for use at a relatively high temperature. The magnetic memory device 30-1 is designed to have relatively low RA (resistance area product) and small thermal stability so that writing at a low temperature can be performed more easily than the magnetic memory device 30-2. The magnetic memory device 30-2 is designed to have relatively high RA and high thermal stability so that writing at a high temperature can be performed more easily than the magnetic memory device 30-1.

The magnetic memory device 30-1 and the magnetic memory device 30-2 having different characteristics are realized by changing the material, processing conditions, size, and the like of the magnetic memory device 30. For example, different characteristics can be obtained by changing the material of each layer. Different characteristics can be obtained also by changing processing conditions such as film formation and etching. Different characteristics can be obtained also by changing the layer thickness or area of each layer. The magnetic memory device 30-2 may be different from the magnetic memory device 30-1 in at least one of the material, the processing condition, and the size.

Figure 6:
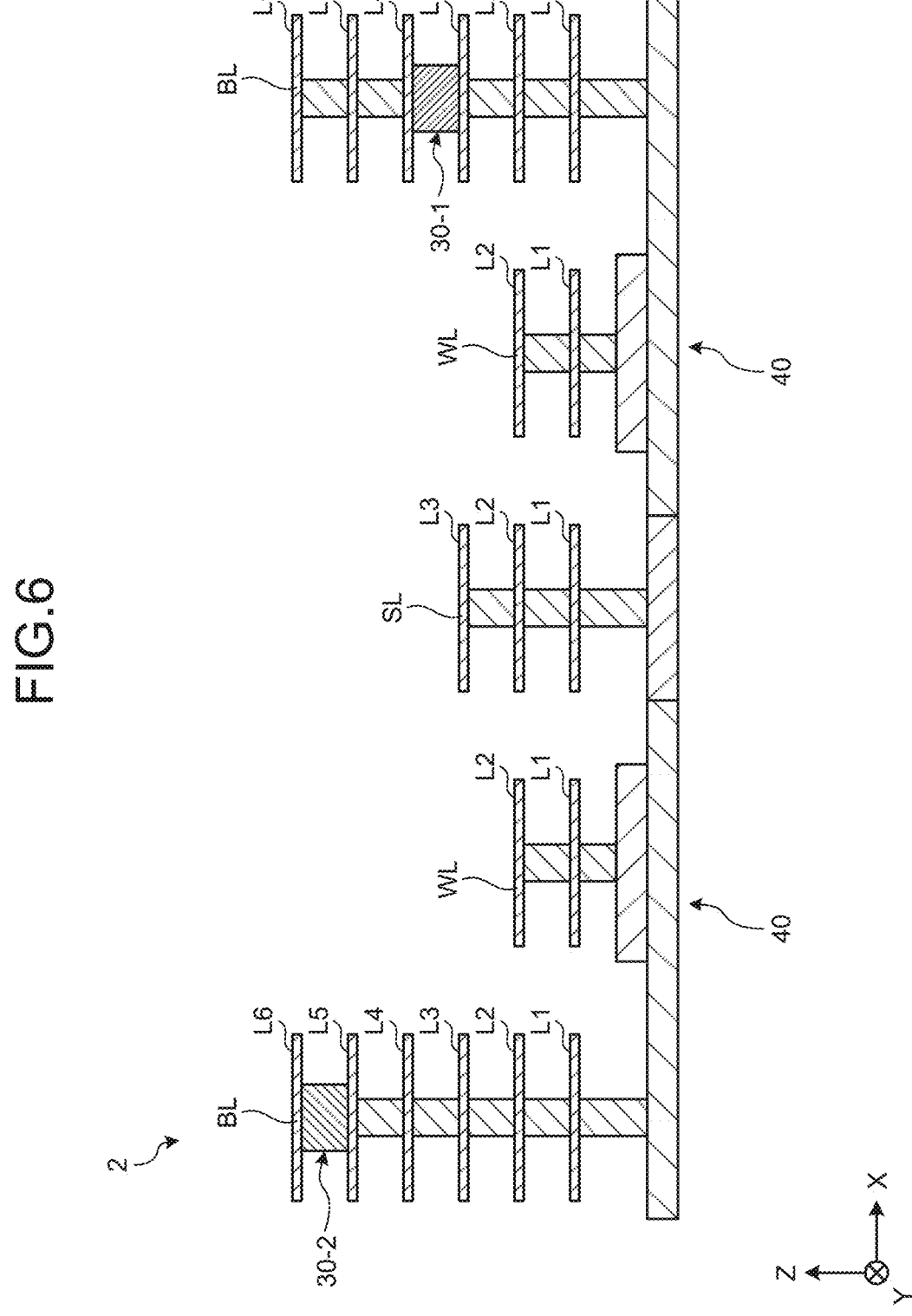
FIG. 6 is a sectional view schematically depicting an example of disposition of a magnetic memory device.

FIG. 6 is a sectional view schematically depicting an example of disposition of a magnetic memory device. Wiring layers L1 to L6 are exemplified as a wiring layer provided above the selection transistor 40 (on the Z-axis positive direction side). The wiring layer L1, the wiring layer L2, the wiring layer L3, the wiring layer L4, the wiring layer L5, and the wiring layer L6 are stacked in this order in the Z-axis positive direction. Although not denoted by reference numerals, vias and the like for connecting the respective wiring layers are also illustrated.

In the example illustrated in FIG. 6, the magnetic memory device 30-1 and the magnetic memory device 30-2 are disposed at positions having different heights. Specifically, the magnetic memory device 30-1 and the magnetic memory device 30-2 are disposed between different wiring layers. In this example, the magnetic memory device 30-1 is provided between the wiring layer L3 and the wiring layer L4. The magnetic memory device 30-2 is provided between the wiring layer L5 and the wiring layer L6. The bit line BL, the sense line SL, and the word line WL are provided in different wiring layers, in this example, in the wiring layer L6, the wiring layer L3, and the wiring layer L2, respectively.

In an extending direction of the word line WL, that is, in the Y-axis direction, the plurality of magnetic memory devices 30-1 are disposed adjacent to each other, and the magnetic memory devices 30-2 are disposed adjacent to each other. In the X-axis direction, the plurality of magnetic memory devices 30-1 and the plurality of magnetic memory devices 30-2 are alternately disposed.

Figure 7:
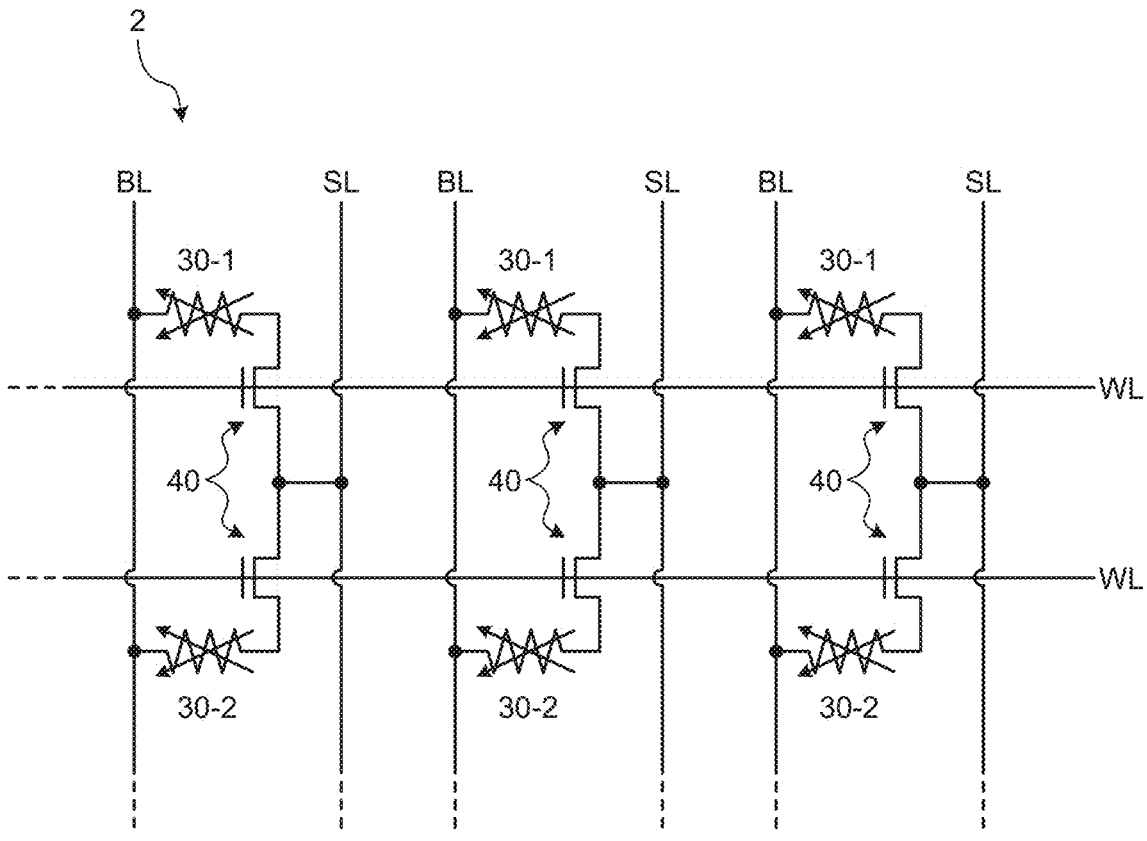
FIG. 7 is a diagram depicting an example of an equivalent circuit of a memory cell array.

FIG. 7 is a diagram depicting an example of an equivalent circuit of a memory cell array. Three bit lines BL, three sense lines SL, and two word lines WL are exemplified. One of the two word lines WL is connected to the gate electrode of the selection transistor 40 to which the magnetic memory device 30-1 is connected. The other word line WL is connected to the gate electrode of the selection transistor 40 to which the magnetic memory device 30-2 is connected. That is, each of the plurality of word lines WL is exclusively connected to the gate electrode of the selection transistor 40 to which the magnetic memory device 30-1 is connected and the gate electrode of the selection transistor 40 to which the magnetic memory device 30-2 is connected. The magnetic memory device 30-1 and the magnetic memory device 30-2 can be exclusively selected by the bit line BL, the sense line SL, and the word line WL.

Description returns to FIG. 1. The detection circuit 7 detects the environmental value and generates a signal indicating the detection result. The signal generated by the detection circuit 7 is referred to as a detection signal TH. Examples of the detection signal TH include a signal indicating a magnitude relationship between the detected environmental value and the predetermined value, and a signal indicating a range of the detected environmental value.

As described above, it is assumed here that the environmental value is a temperature. In this case, the detection circuit 7 may be a temperature detection circuit that detects the temperature of the memory macro 1, more specifically, the memory cell array 2. Various known methods may be used for the temperature detection. For example, wiring (resistor), a diode, and the like for temperature detection may be provided in the memory cell array 2. The temperature is detected from changes in their electrical characteristics due to the temperature change. When the detection circuit 7 detects light, a magnetic field, an impact, or the like, the detection circuit 7 may be an optical detection circuit, a magnetic detection circuit, an impact detection circuit, or the like. Various known methods may be used for the detection.

In the following description, it is assumed that the detection signal TH is a signal indicating a magnitude relationship between a detected temperature and a predetermined temperature. The predetermined temperature is a reference (threshold) for switching between the magnetic memory device 30-1 and the magnetic memory device 30-2, and is referred to as a switching temperature TS. For example, the detection signal TH is a signal indicating that the detected temperature is equal to or lower than the value of the switching temperature TS, that is, a low temperature, or indicating that the detected temperature is larger (higher) than the value of the switching temperature TS, that is, a high temperature. The switching temperature TS may be determined to have hysteresis.

The switching temperature TS is set to a temperature at a boundary between a temperature range in which the magnetic memory device 30-1 has practical retention and a temperature range in which the magnetic memory device 30-2 has practical retention, or a temperature within a range in which these temperature ranges overlap. In the examples of FIGS. 4 and 5 described above, the magnetic memory device 30-1 has practical retention within the range of the temperature T11 to the temperature T12, and the magnetic memory device 30-2 has practical retention within the range of the temperature T21 to the temperature T22. Thus, the switching temperature TS is set to be equal to or lower than the temperature 112 and equal to or higher than the temperature T21.

The detection circuit 7 outputs the generated detection signal TH. The detection signal TH output by the detection circuit 7 is input to the selection circuit 8.

The selection circuit 8 is connected to the memory cell array 2 via the bit line BL, the sense line SL, the word line WL, and the like. A portion of the selection circuit 8 to which the wiring extending in the X-axis direction is connected is also referred to as a selection circuit 81 and illustrated in the drawing. A portion to which the wiring extending in the Y-axis direction is connected is also referred to as a selection circuit 82 and illustrated in the drawing. The selection circuit 8 selects a desired magnetic memory device 30 from the plurality of magnetic memory devices 30 (magnetic memory devices 30 in the plurality of memory cells 3) included in the memory cell array 2. The selection is performed by voltage application or the like to the bit line BL, the word line WL, and the sense line SL (activation of wiring). The selection circuit 8 may have the same configuration as various known memory selection circuits.

In the present embodiment, the selection circuit 8 exclusively selects the magnetic memory device 30-1 and the magnetic memory device 30-2 based on the detection result of the detection circuit 7, more specifically, the detection signal TH. The magnetic memory device 30-1 and the magnetic memory device 30-2 are switched according to the temperature. Specifically, in a case where the detection signal TH indicates a low temperature, the selection circuit 8 selects the magnetic memory device 30-1. When the detection signal TH indicates a high temperature, the selection circuit 8 selects the magnetic memory device 30-2.

Figure 8:
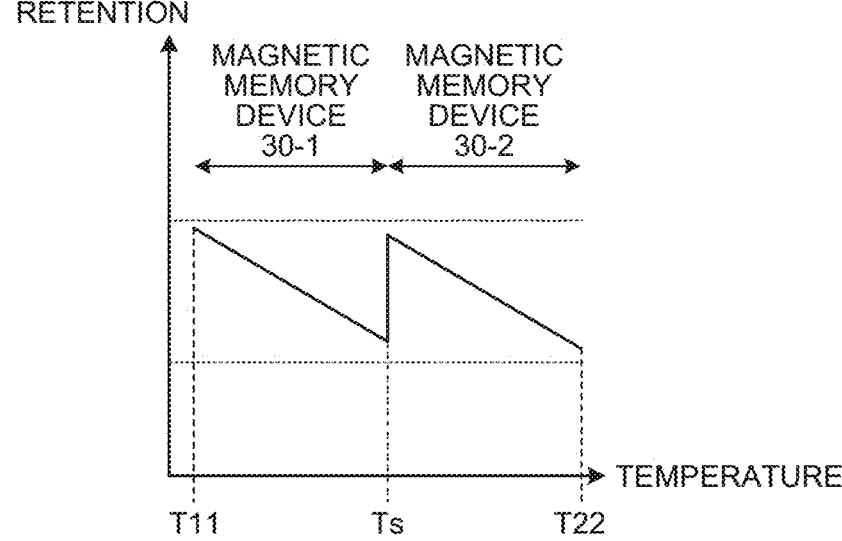
FIG. 8 is a diagram schematically depicting an example of switching of magnetic memory devices.

FIG. 8 is a diagram schematically depicting an example of switching of magnetic memory devices. The magnetic memory device 30-1 is selected within the range of the temperature T11 to the switching temperature TS, that is, at a low temperature. The magnetic memory device 30-2 is selected within the range of the switching temperature TS to the temperature T22, that is, at a high temperature. As described above, the operating conditions of the magnetic memory device 30-1 at a low temperature is the same as the operating conditions of the magnetic memory device 30-2 at a high temperature. Thus, it is possible to obtain practical retention in a wide temperature range from the temperature T11 to the temperature T22 while maintaining the same operation conditions. That is, even in a case where the read or write characteristics fluctuate due to temperature dependence of the MTJ device, it is possible to keep the MTJ device characteristics at all the use temperatures within the operating conditions that can be handled by the selection transistors 40 of the same design by appropriately switching the plurality of MTJ devices.

Figure 9:
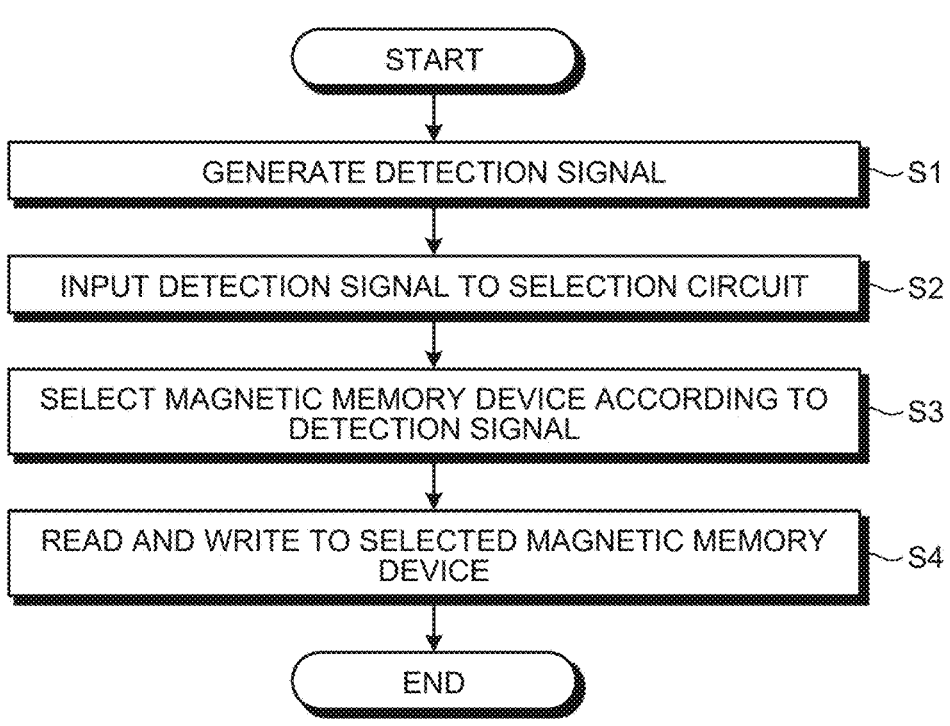
FIG. 9 is a flowchart depicting an example of processing executed in a storage device.

FIG. 9 is a flowchart depicting an example of processing executed in a storage device. This processing is started, for example, in response to a request to read/write information from/to the storage device 100. Detailed description of contents overlapping with the contents described so far will not be repeated.

In Step S1, the detection circuit 7 detects, for example, the temperature, and generates and outputs the detection signal TH. In Step S2, the detection signal TH is input to the selection circuit 8. In Step S3, the selection circuit 8 selects the magnetic memory device 30 according to the detection signal TH. The magnetic memory device 30-1 and the magnetic memory device 30-2 are exclusively selected. In Step S4, the selection circuit 8 reads and writes information from and to the selected magnetic memory device 30.

As described above for example, two types of magnetic memory devices 30, that is, the magnetic memory device 30-1 and the magnetic memory device 30-2 are exclusively selected (switched) according to the temperature, and reading and writing of information are performed. Information can be read and written over a wide temperature range as compared with the case of using only one type of magnetic memory device 30. Since it is not necessary to change the operation conditions, it is easy to apply to a temperature change.

A method for manufacturing the memory cell array 2 in a case where the memory cell array 2 includes two types of magnetic memory devices 30, the magnetic memory device 30-1 and the magnetic memory device 30-2, will be described. The method for manufacturing the memory cell array 2 includes a step of preparing the semiconductor substrate 60 (substrate preparation step), a step of forming wiring, and a step of stacking and forming the wiring and the magnetic memory device 30 (the magnetic memory device 30-1 and the magnetic memory device 30-2) such that the magnetic memory device 30 is positioned between the wiring layers (staking and formation step). In the stacking and formation step, wiring layers (for example, the wiring layer L1 to the wiring layer L6) including the bit line BL, the sense line SL, and the word line WL are sequentially formed. At this time, the magnetic memory device 30 is formed between the wiring layers. The stacked structure of the magnetic memory device 30 is obtained, for example, by sequentially depositing each layer from the underlayer 31 to the cap layer 37 in a vacuum apparatus. Further, the magnetic memory device 30 forms a pattern by processing such as etching. For example, the magnetic memory device 30 is formed in a pillar shape by ion milling or the like.

By providing the magnetic memory device 30-1 and the magnetic memory device 30-2 between different wiring layers as in FIG. 6 described above, the magnetic memory device 30-1 and the magnetic memory device 30-2 are formed at different timings. In the example illustrated in FIG. 6, when the magnetic memory device 30-1 positioned on the lower side is formed, the magnetic memory device 30-2 to be formed thereafter does not exist yet, and it becomes easy to secure a space in the lateral direction of the magnetic memory device 30-1. Accordingly, for example, adhesion of foreign matter, which may be generated by pillar formation, to an adjacent device or the like can be prevented, and a short risk or the like can be reduced.

2. Modification

In the above embodiment, an example has been described in which the magnetic memory device 30-1 and the magnetic memory device 30-2 are connected to the word lines WL different from each other. However, the magnetic memory device 30-1 and the magnetic memory device 30-2 may be connected to different bit lines BL (and sense lines SL).

Figure 10:
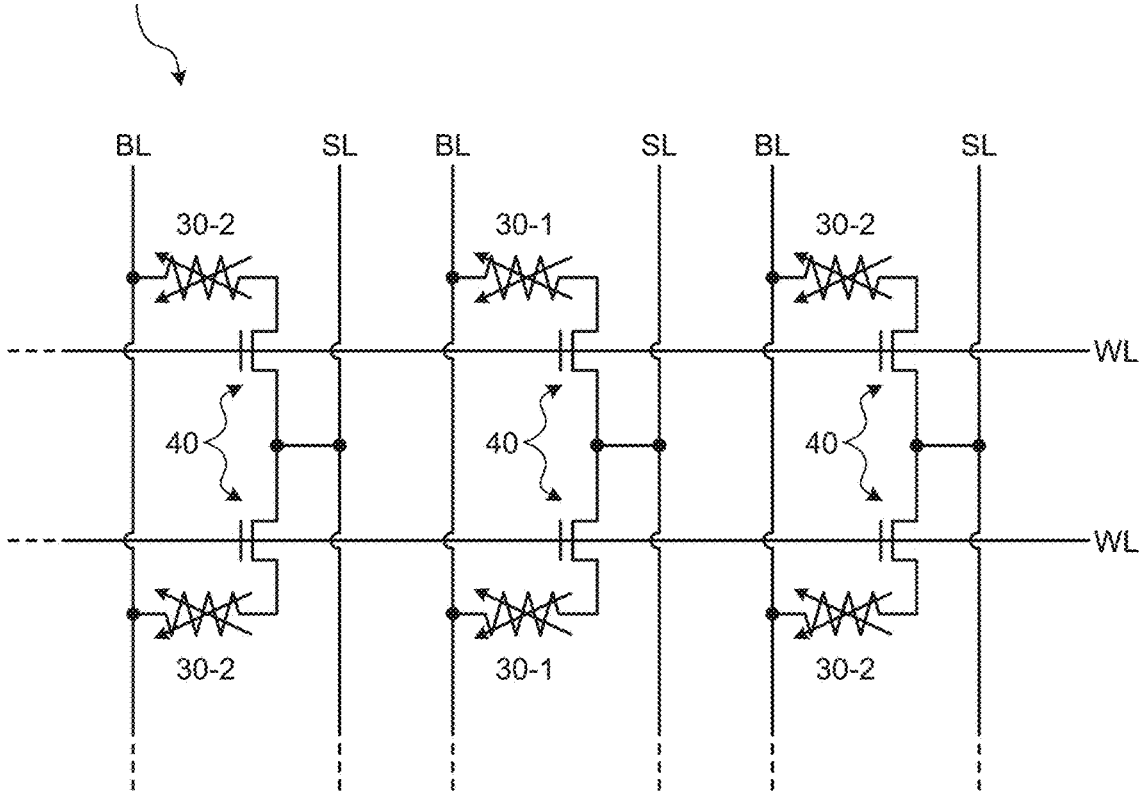
FIG. 10 is a diagram depicting an example of an equivalent circuit of a memory cell array.

FIG. 10 is a diagram depicting an example of an equivalent circuit of a memory cell array. The central bit line BL (and the sense line SL) among the three bit lines BL is connected to the magnetic memory device 30-1 (and the selection transistor 40 connected to the magnetic memory device 30-1). The bit lines BL (and the sense lines SL) on both sides are connected to the magnetic memory device 30-2 (and the selection transistor 40 connected to the magnetic memory device 30-2). That is, each of the plurality of bit lines BL is exclusively connected to the magnetic memory device 30-1 and the magnetic memory device 30-2. The magnetic memory device 30-1 and the magnetic memory device 30-2 can be exclusively selected also by the bit line BL, the sense line SL, and the word line WL.

In the above embodiment, an example has been described in which the magnetic memory device 30-1 and the magnetic memory device 30-2 are disposed at positions having different heights. However, the magnetic memory device 30-1 and the magnetic memory device 30-2 may be disposed at the same height.

Figure 11:
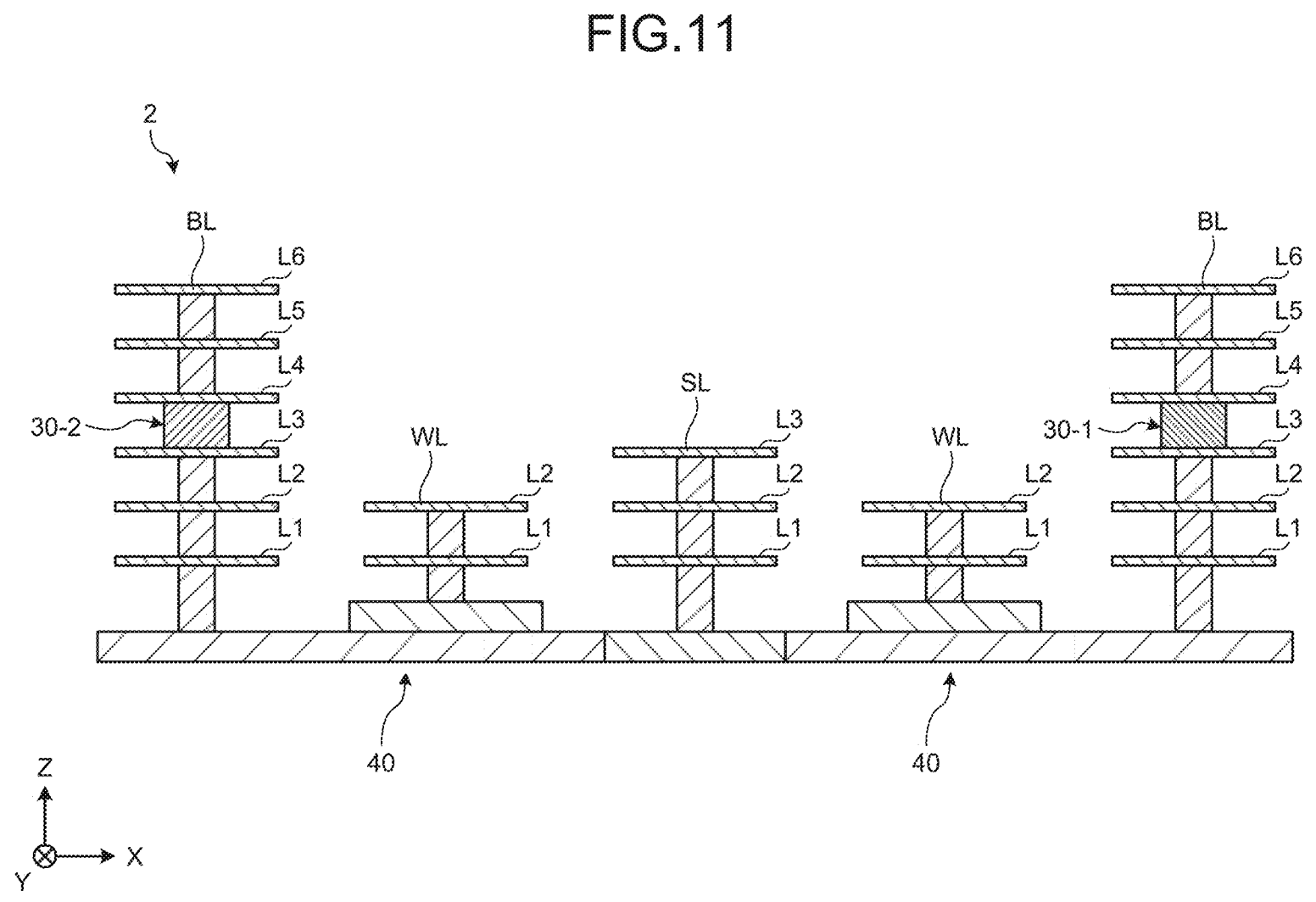

FIG. 11 is a sectional view schematically depicting an example of disposition of a magnetic memory device. The magnetic memory device 30-1 and the magnetic memory device 30-2 are disposed at the same height. Specifically, the magnetic memory device 30-1 and the magnetic memory device 30-2 are disposed between the same wiring layers. In this example, both the magnetic memory device 30-1 and the magnetic memory device 30-2 are provided between the wiring layer L3 and the wiring layer L4. The magnetic memory device 30-1 and the magnetic memory device 30-2 are formed in the same process, which is efficient.

In the above embodiment, an example has been described in which the storage device 100 includes one memory macro 1. However, the storage device 100 may include a plurality of memory macros 1. In this case, the magnetic memory devices 30 of different types may be disposed in the memory cell array 2 of different memory macros 1.

Figure 12:
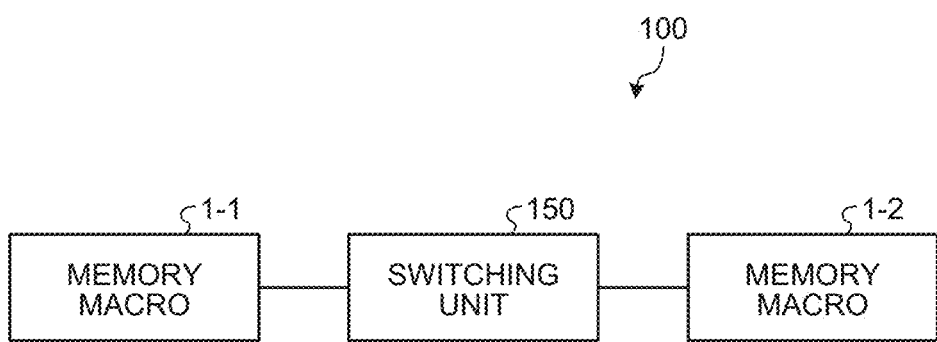
FIG. 12 is a diagram depicting an example of a schematic configuration of a storage device.

FIG. 12 is a diagram depicting an example of a schematic configuration of a storage device. In this example, the storage device 100 includes two memory macros 1 and a switching unit 150. The memory macros 1 are referred to as a memory macro 1-1 and a memory macro 1-2 so that the memory macros 1 can be distinguished from each other. The memory macro 1-1 and the memory macro 1-2 include different types of magnetic memory devices 30. For example, the magnetic memory device 30-1 is disposed in the memory cell array 2 of the memory macro 1-1, and the magnetic memory device 30-2 is disposed in the memory cell array 2 of the memory macro 1-1. The switching unit 150 controls the selection circuit 8 of each of the memory macro 1-1 and the memory macro 1-2 so as to switch the magnetic memory device 30-1 and the magnetic memory device 30-2 according to the environmental value. The environmental value is given to the switching unit 150 as, for example, the detection signal TH from the detection circuit 7 in the memory macro 1-1 or the memory macro 1-2.

In the above embodiment, an example has been described in which two types of the magnetic memory device 30-1 and the magnetic memory device 30-2 having different characteristics are used. However, three or more types of magnetic memory devices 30 having different characteristics may be used. For example, in a case where three types of magnetic memory devices 30 are used, the detection signal TH generated by the detection circuit 7 may be a signal indicating any one of three types of a low temperature, a middle temperature, and a high temperature. The selection circuit 8 may exclusively select the magnetic memory devices 30 of three types based on the detection signal TH.

The number of the magnetic memory devices 30-1 and the number of the magnetic memory devices 30-2 included in the memory cell array 2 may be the same or different. In the latter case, the magnetic memory device 30-1 and the magnetic memory device 30-2 may be configured to be switchable only in a partial region of the memory cell array 2.

The stacked structure of the magnetic memory device 30 is not limited to the example depicted in FIG. 3. For example, the magnetic memory device 30 does not have to include the upper tunnel barrier layer 35 or the upper magnetization fixed layer 36. The present invention is not limited to this configuration, and various known stacked structures of MTJ may be adopted.

3. Example of Applications

The storage device 100 described above can be used for various purposes. For example, the storage device 100 is used by being mounted on an electronic device. Examples of the electronic device include a game device, a mobile device such as a smartphone or a tablet terminal, a notebook PC, a wearable device, a music device, a video device, and a digital camera. The storage device 100 may be used as a portable data unit, a fixed data unit, or the like.

A magnetic head including a plurality of types of magnetic memory devices 30, for example, the magnetic memory device 30-1 and the magnetic memory device 30-2 is also an example of the application. The present invention can also be applied to a hard disk drive, a magnetic sensor device, and the like equipped with the magnetic head. The magnetic head may have a configuration (detection unit, selection unit, and the like) similar to the detection circuit 7 and the selection circuit 8 described above, for example, and these units may exclusively select the magnetic memory device 30-1 and the magnetic memory device 30-2.

4. Example of Effects

The technology described above is specified as follows, for example. One of the technologies to be disclosed is the storage device 100. As described with reference to FIGS. 1 to 9 and the like, the storage device 100 includes a plurality of magnetic memory devices 30 and the selection circuit 8 that selects a desired magnetic memory device 30 from the plurality of magnetic memory devices 30. The plurality of magnetic memory devices 30 include the magnetic memory device 30-1 (first magnetic memory device) having a characteristic that changes according to an environmental value, and the magnetic memory device 30-1 (second magnetic memory device) having a characteristic different from that of the magnetic memory device 30-2. The selection circuit 8 exclusively selects the magnetic memory device 30-1 and the magnetic memory device 30-2 based on the detection result of the environmental value.

According to the storage device 100 described above, by exclusively selecting, that is, switching and using the magnetic memory device 30-1 and the magnetic memory device 30-2 of different types having different characteristics, it is possible to adapt to a wider range of environmental values than a case of using only one type of magnetic memory device 30. Application to environmental changes can be facilitated.

The magnetic memory device 30-2 may be different from the magnetic memory device 30-1 in at least one of the material, the processing condition, and the size. The magnetic memory device 30-1 and the magnetic memory device 30-2 having different characteristics from each other can be obtained in this manner, for example.

The environmental value may include at least one of a value indicating a temperature (directly or indirectly), a value indicating a magnetic field, a value indicating light, and a value indicating an impact. Application to environmental changes represented by such various environmental values can be facilitated.

As described with reference to FIGS. 4, 5, 8, and the like, the selection circuit 8 may select the magnetic memory device 30-1 in a case where the environmental value is equal to or less than a predetermined value (for example, the temperature is equal to or lower than the switching temperature TS), and select the magnetic memory device 30-2 in a case where the environmental value is larger than the predetermined value (for example, the temperature is higher than the switching temperature TS). In that case, the operating conditions (for example, the voltage Vc) for writing information to the magnetic memory device 30-1 in a case where the environmental value is equal to or lower than a predetermined value and the operating conditions for writing information to the magnetic memory device 30-2 in a case where the environmental value is larger than the predetermined value may be the same. Since it is not necessary to change the operation conditions, application to environmental changes is facilitated.

As described with reference to FIG. 6 and the like, the magnetic memory device 30-1 and the magnetic memory device 30-2 may be provided between different wiring layers. For example, at the time of manufacturing, it is easy to secure a space in the lateral direction when one magnetic memory device 30 is formed, and a short risk or the like can be reduced.

As described with reference to FIG. 11 and the like, the magnetic memory device 30-1 and the magnetic memory device 30-2 may be provided between the same wiring layers. For example, at the time of manufacturing, the magnetic memory device 30-1 and the magnetic memory device 30-2 can be efficiently manufactured in the same process.

As described with reference to FIGS. 1, 2, 6, 7, and the like, the storage device 100 may further include a plurality of bit lines BL, a plurality of sense lines SL, a plurality of word lines WL, and a plurality of selection transistors 40. The plurality of bit lines BL may extend from the plurality of magnetic memory devices 30 (from the memory cell array 2) to the selection circuit 8. The plurality of sense lines SL may extend from the plurality of magnetic memory devices 30 to the selection circuit 8. The plurality of word lines WL may intersect the plurality of bit lines BL and extend from the plurality of magnetic memory devices 30 to the selection circuit 8. Each of the plurality of selection transistors 40 may be provided corresponding to one magnetic memory device 30. Each of the plurality of magnetic memory devices 30 may be disposed in association with an intersection of the plurality of bit lines BL and the plurality of word lines WL. The magnetic memory device 30 and the selection transistor 40 corresponding to each other may be connected between the corresponding bit line BL and the sense line SL. The gate electrode of the selection transistor 40 may be connected to the corresponding word line WL. Each of the plurality of word lines WL may be exclusively connected to the gate electrode of the selection transistor 40 to which the magnetic memory device 30-1 is connected and the gate electrode of the selection transistor 40 to which the magnetic memory device 30-2 is connected. Alternatively, as described with reference to FIG. 10 and the like, each of the plurality of bit lines BL may be exclusively connected to the magnetic memory device 30-1 and the magnetic memory device 30-2. The magnetic memory device 30-1 and the magnetic memory device 30-2 can be exclusively selected in this manner, for example.

As described with reference to FIG. 12 and the like, the magnetic memory device 30-1 and the magnetic memory device 30-2 may be disposed in different memory cell arrays 2 (for example, the memory cell array 2 of the memory macro 1-1 and the memory cell array 2 of the memory macro 1-2). Such disposition of the magnetic memory device 30-1 and the magnetic memory device 30-2 is also possible.

The memory cell array 2 described with reference to FIGS. 1 to 9 and the like is also one of the technologies to be disclosed. The memory cell array 2 includes the magnetic memory device 30-1 having a characteristic that changes according to an environmental value, the magnetic memory device 30-2 having a characteristic different from that of the magnetic memory device 30-1, and a wiring (bit line BL, sense line SL, and word line WL) that can exclusively select the magnetic memory device 30-1 and the magnetic memory device 30-2. Such a memory cell array 2 can also facilitate application to environmental changes as described above. A method for manufacturing the memory cell array 2 is also one of the technologies to be disclosed. The method for manufacturing the memory cell array 2 includes forming the magnetic memory device 30-1 having a characteristic that changes according to an environmental value, forming the magnetic memory device 30-2 having a characteristic different from that of the magnetic memory device 30-1, and forming a wiring (bit line BL, sense line SL, and word line WL) that can exclusively select the magnetic memory device 30-1 and the magnetic memory device 30-2.

A magnetic head including the magnetic memory device 30-1 and the magnetic memory device 30-2 is also one of the technologies to be disclosed. The magnetic head is configured to be able to exclusively select the magnetic memory device 30-1 and the magnetic memory device 30-2. An electronic device on which the storage device 100 is mounted is also one of the technologies to be disclosed. Such a magnetic head or electronic device also can facilitate application to environmental changes as described above.

The effects described in the present disclosure are merely examples and are not limited to the disclosed contents. There may be other effects.

Although the above description is given regarding the embodiments of the present disclosure, the technical scope of the present disclosure is not limited to the above-described embodiments as they are, and various modifications can be made without departing from the scope of the present disclosure.

The present technology may also take the following configurations.

(1) A storage device comprising:

a plurality of magnetic memory devices; and a selection circuit that selects a desired magnetic memory device from the plurality of magnetic memory devices, wherein the plurality of magnetic memory devices includes:

a first magnetic memory device having a characteristic that changes according to an environmental value; and a second magnetic memory device having a characteristic different from the characteristic of the first magnetic memory device, and the selection circuit exclusively selects the first magnetic memory device and the second magnetic memory device based on a detection result of the environmental value.

(2) The storage device according to (1), wherein the second magnetic memory device is different from the first magnetic memory device in at least one of a material, a processing condition, and a size.

(3) The storage device according to (1) or (2), wherein the environmental value includes at least one of a value indicating a temperature, a value indicating a magnetic field, a value indicating light, and a value indicating an impact.

(4) The storage device according to any one of (1) to (3), wherein the selection circuit selects the first magnetic memory device when the environmental value is equal to or less than a predetermined value, and selects the second magnetic memory device when the environmental value is larger than the predetermined value.

(5) The storage device according to (4), wherein an operating condition for writing information to the first magnetic memory device when the environmental value is equal to or less than the predetermined value is the same as an operating condition for writing information to the second magnetic memory device when the environmental value is larger than the predetermined value.

(6) The storage device according to any one of (1) to (5), wherein the first magnetic memory device and the second magnetic memory device are provided between different wiring layers.

(7) The storage device according to any one of (1) to (5), wherein the first magnetic memory device and the second magnetic memory device are provided between same wiring layers.

(8) The storage device according to any one of (1) to (7), further comprising:
a plurality of bit lines extending from the plurality of magnetic memory devices to the selection circuit;
a plurality of sense lines extending from the plurality of magnetic memory devices to the selection circuit;
a plurality of word lines intersecting the plurality of bit lines and extending from the plurality of magnetic memory devices to the selection circuit; and
a plurality of selection transistors each provided corresponding to one of the magnetic memory devices, wherein
each of the plurality of magnetic memory devices is disposed in association with an intersection of the plurality of bit lines and the plurality of word lines,
the magnetic memory device and the selection transistor corresponding to each other are connected between a corresponding bit line among the plurality of bit lines and a corresponding sense line among the plurality of sense lines,
a gate electrode of the selection transistor is connected to a corresponding word line among the plurality of word lines, and
each of the plurality of word lines is exclusively connected to the gate electrode of the selection transistor to which the first magnetic memory device is connected and a gate electrode of the selection transistor to which the second magnetic memory device is connected.

(9) The storage device according to any one of (1) to (7), further comprising:
a plurality of bit lines extending from the plurality of magnetic memory devices to the selection circuit;
a plurality of sense lines extending from the plurality of magnetic memory devices to the selection circuit;
a plurality of word lines intersecting the plurality of bit lines and extending from the plurality of magnetic memory devices to the selection circuit; and

a plurality of selection transistors each provided corresponding to one of the magnetic memory devices, wherein
each of the plurality of magnetic memory devices is disposed in association with an intersection of the plurality of bit lines and the plurality of word lines,
the magnetic memory device and the selection transistor corresponding to each other are connected between a corresponding bit line among the plurality of bit lines and a corresponding sense line among the plurality of sense lines,
a gate electrode of the selection transistor is connected to a corresponding word line among the plurality of word lines, and
each of the plurality of bit lines is exclusively connected to the first magnetic memory device and the second magnetic memory device.

(10) The storage device according to any one of (1) to (9), wherein the first magnetic memory device and the second magnetic memory device are disposed in different memory cell arrays.

(11) A memory cell array comprising:
a first magnetic memory device having a characteristic that changes according to an environmental value;
a second magnetic memory device having a characteristic different from the characteristic of the first magnetic memory device; and
a wiring capable of exclusively selecting the first magnetic memory device and the second magnetic memory device.

(12) A method for manufacturing a memory cell array, the method comprising:
forming a first magnetic memory device having a characteristic that changes according to an environmental value;
forming a second magnetic memory device having a characteristic different from the characteristic of the first magnetic memory device; and
forming a wiring capable of exclusively selecting the first magnetic memory device and the second magnetic memory device.

(13) A magnetic head comprising:
a first magnetic memory device having a characteristic that changes according to an environmental value; and
a second magnetic memory device having a characteristic different from the characteristic of the first magnetic memory device,
the magnetic head being configured to be capable of exclusively selecting the first magnetic memory device and the second magnetic memory device.

(14) An electronic device on which a storage device is mounted, wherein
the storage device includes:
a plurality of magnetic memory devices; and
a selection circuit that selects a desired magnetic memory device from the plurality of magnetic memory devices,
the plurality of magnetic memory devices includes:
a first magnetic memory devices having a characteristic that changes according to an environmental value; and
a second magnetic memory devices having a characteristic different from the characteristic of the first magnetic memory devices, and
the selection circuit exclusively selects the first magnetic memory device and the second magnetic memory device based on a detection result of the environmental value.

REFERENCE SIGNS LIST

1 MEMORY MACRO
2 MEMORY CELL ARRAY
3 MEMORY CELL
7 DETECTION CIRCUIT
8 SELECTION CIRCUIT
30 MAGNETIC MEMORY DEVICE
30-1 MAGNETIC MEMORY DEVICE (FIRST MAGNETIC MEMORY DEVICE)
30-2 MAGNETIC MEMORY DEVICE (SECOND MAGNETIC MEMORY DEVICE)
31 UNDERLAYER
32 MAGNETIZATION FIXED LAYER
33 INSULATING LAYER
34 STORAGE LAYER
35 UPPER TUNNEL BARRIER LAYER
36 UPPER MAGNETIZATION FIXED LAYER
37 CAP LAYER
40 SELECTION TRANSISTOR
41 SOURCE REGION
42 DRAIN REGION
50 DEVICE ISOLATION REGION
60 SEMICONDUCTOR SUBSTRATE
100 STORAGE DEVICE
150 SWITCHING UNIT
L1 WIRING LAYER
L2 WIRING LAYER
L3 WIRING LAYER
L4 WIRING LAYER
L5 WIRING LAYER
L6 WIRING LAYER
WL WORD LINE
BL BIT LINE
SL SENSE LINE

The invention claimed is:

1. A storage device, comprising:
a plurality of magnetic memory devices; and
a selection circuit configured to select a desired magnetic memory device from the plurality of magnetic memory devices, wherein
the plurality of magnetic memory devices includes:
  a first magnetic memory device having a first characteristic that changes based on an environmental value; and
  a second magnetic memory device having a second characteristic different from the first characteristic of the first magnetic memory device, and the selection circuit is further configured to exclusively select:
  the first magnetic memory device based on the environmental value is one of equal to or less than a specific value; and
  the second magnetic memory device based on the environmental value is larger than the specific value.

2. The storage device according to claim 1, wherein
the second magnetic memory device is different from the first magnetic memory device in at least one of a material, a processing condition, or a size.

3. The storage device according to claim 1, wherein
the environmental value includes at least one of a value indicating a temperature, a value indicating a magnetic field, a value indicating light, or a value indicating an impact.

4. The storage device according to claim 1, wherein
a first operating condition to write first information to the first magnetic memory device based on the environmental value is one of equal to or less than the specific value is same as a second operating condition to write second information to the second magnetic memory device based on the environmental value is larger than the specific value.

5. The storage device according to claim 1, wherein
the first magnetic memory device and the second magnetic memory device are between different wiring layers.

6. The storage device according to claim 1, wherein
the first magnetic memory device and the second magnetic memory device are between same wiring layers.

7. The storage device according to claim 1, further comprising:
a plurality of bit lines extending from the plurality of magnetic memory devices to the selection circuit;
a plurality of sense lines extending from the plurality of magnetic memory devices to the selection circuit;
a plurality of word lines intersecting the plurality of bit lines, wherein the plurality of word lines extends from the plurality of magnetic memory devices to the selection circuit; and
a plurality of selection transistors, wherein each selection transistor of the plurality of selection transistors corresponds to one of the plurality of magnetic memory devices, wherein
each magnetic memory device of the plurality of magnetic memory devices is in association with an intersection of the plurality of bit lines and the plurality of word lines,
the each magnetic memory device of the plurality of magnetic memory devices corresponding to the plurality of selection transistors is connected between a corresponding bit line of the plurality of bit lines and a corresponding sense line of the plurality of sense lines,
each gate electrode of the plurality of selection transistors is connected to a corresponding word line of the plurality of word lines, and
each word line of the plurality of word lines is exclusively connected to a first gate electrode of the plurality of selection transistors to which the first magnetic memory device is connected and a second gate electrode of the plurality of selection transistors to which the second magnetic memory device is connected.

8. The storage device according to claim 1, further comprising:
a plurality of bit lines extending from the plurality of magnetic memory devices to the selection circuit;
a plurality of sense lines extending from the plurality of magnetic memory devices to the selection circuit;
a plurality of word lines intersecting the plurality of bit lines, wherein the plurality of word lines extends from the plurality of magnetic memory devices to the selection circuit; and
a plurality of selection transistors, wherein each selection transistor of the plurality of selection transistors corresponds to one of the plurality of magnetic memory devices, wherein
each magnetic memory device of the plurality of magnetic memory devices is in association with an intersection of the plurality of bit lines and the plurality of word lines,
the each magnetic memory device of the plurality of magnetic memory devices corresponding to the plurality of selection transistors is connected between a corresponding bit line of the plurality of bit lines and a corresponding sense line of the plurality of sense lines, a gate electrode of the plurality of selection transistors is connected to a corresponding word line of the plurality of word lines, and each bit line of the plurality of bit lines is exclusively connected to the first magnetic memory device and the second magnetic memory device.

9. The storage device according to claim 1, wherein the first magnetic memory device and the second magnetic memory device are in different memory cell arrays.

10. A memory cell array, comprising:

a first magnetic memory device having a first characteristic that changes based on an environmental value;

a second magnetic memory device having a second characteristic different from the first characteristic of the first magnetic memory device; and a wiring configured to exclusively select:

the first magnetic memory device based on the environmental value is one of equal to or less than a specific value; and the second magnetic memory device based on the environmental value is larger than the specific value.

11. A method for manufacturing a memory cell array, the method comprising:

forming a first magnetic memory device having a first characteristic that changes based on an environmental value;

forming a second magnetic memory device having a second characteristic different from the first characteristic of the first magnetic memory device; and forming a wiring for exclusively selecting:

the first magnetic memory device based on the environmental value is one of equal to or less than a specific value; and the second magnetic memory device based on the environmental value is larger than the specific value.

12. A magnetic head, comprising:

a first magnetic memory device having a first characteristic that changes based on an environmental value; and a second magnetic memory device having a second characteristic different from the first characteristic of the first magnetic memory device, wherein the magnetic head is configured to exclusively select:

the first magnetic memory device based on the environmental value is one of equal to or less than a specific value; and the second magnetic memory device based on the environmental value is larger than the specific value.

13. An electronic device, comprising:

a storage device mounted on the electronic device, wherein the storage device includes:

a plurality of magnetic memory devices; and a selection circuit configured to select a desired magnetic memory device from the plurality of magnetic memory devices, wherein the plurality of magnetic memory devices includes:

a first magnetic memory devices having a first characteristic that changes based on an environmental value; and a second magnetic memory devices having a second characteristic different from the first characteristic of the first magnetic memory devices, and the selection circuit is further configured to exclusively select:

the first magnetic memory devices based on the environmental value is one of equal to or less than a specific value; and the second magnetic memory devices based on the environmental value is larger than the specific value.

* * * * *